United States Patent
Dubey

(10) Patent No.: US 7,126,369 B2
(45) Date of Patent: Oct. 24, 2006

(54) TRANSCEIVER PROVIDING HIGH SPEED TRANSMISSION SIGNAL USING SHARED RESOURCES AND REDUCED AREA

(75) Inventor: Hari B. Dubey, Dt-Ghazipur (IN)

(73) Assignee: STMicroelectronics Pvt. Ltd., Noida (IN)

( * ) Notice: Subject to any disclaimer, the term of this patent is extended or adjusted under 35 U.S.C. 154(b) by 78 days.

(21) Appl. No.: 11/019,959

(22) Filed: Dec. 21, 2004

(65) Prior Publication Data
US 2005/0156621 A1 Jul. 21, 2005

(30) Foreign Application Priority Data
Dec. 29, 2003 (IN) .......................... 1628/Del/2003

(51) Int. Cl.
H03K 19/0175 (2006.01)
H03K 19/094 (2006.01)
H03K 19/003 (2006.01)

(52) U.S. Cl. .......................... 326/12; 326/82; 326/83; 326/86; 326/87

(58) Field of Classification Search ............ 326/82–83, 326/86–87, 101
See application file for complete search history.

(56) References Cited

U.S. PATENT DOCUMENTS

| | | | |
|---|---|---|---|
| 6,294,930 B1 * | 9/2001 | Goetting et al. | 326/44 |
| 6,377,069 B1 * | 4/2002 | Veenstra et al. | 326/38 |
| 6,472,903 B1 * | 10/2002 | Veenstra et al. | 326/38 |

* cited by examiner

Primary Examiner—Rexford Barnie
Assistant Examiner—Jason Crawford
(74) Attorney, Agent, or Firm—Jenkens & Gilchrist, P.C.

(57) ABSTRACT

A transceiver provides a high-speed transmission signal using shared resources and reduced area. A differential amplifier has its current source/sink connected to a supply terminal. A multiplexing circuit is configured to connect an input of the differential amplifier to an I/O pad so as to output a received input/output signal to internal integrated circuit logic during one mode, or alternatively connect an output of the differential amplifier to the I/O pad so as to output a signal received from the internal integrated circuit logic for input/output during another mode. A level translation operation on the signal may be performed with respect to outputting the signal received from the internal integrated circuit logic.

28 Claims, 6 Drawing Sheets

TRANSCEIVER PROVIDING HIGH SPEED TRANSMISSION SIGNAL USING SHARED RESOURCES AND REDUCED AREA

PRIORITY CLAIM

The present application claims priority from Indian Application for Patent No. 1628/Del/2003 filed Dec. 29, 2003 as a provisional application, and for which a complete application was filed Mar. 22, 2004, the disclosures of which are hereby incorporated by reference.

BACKGROUND OF THE INVENTION

1. Technical Field of the Invention

The present invention relates to an improved transceiver providing high-speed transmission signal using shared resources and reduced area.

2. Description of Related Art

With the advancement of CMOS technology, device sizes have decreased to achieve higher processing speed. High-speed differential signaling systems have been developed to minimize cross talk and capacitive coupling problems. It has also become increasingly difficult to interface core devices operating at a lower voltage to the Input/Output devices operating at a higher voltage. As the core is shrinking, size of the chip is going to be limited by the Input/Output circuit.

To ensure noise free signaling, conventional high-speed signaling systems use voltage translator and current driver circuits, to be coupled to the receiver to enable the system as a transmitter and receiver, better known as transceiver. FIG. 1 illustrates a prior art transceiver circuit. The transceiver circuit consists of translators T1 and T2 for providing translated data fed with inputs I and EN respectively, where I is the low voltage input signal to be translated and EN is the signal for enabling the driver D to transfer the signal to the OUT pad for transmission. Here EN and I are the signals coming from the core. Receiver R is a configuration to receive IN and REF as inputs and output CIN signal that goes to the core, thus enabling reception.

The above said elements are coupled as discrete devices to perform as a signaling system with a drawback of the system being that as the size of the core is scaled down, translation of signals and area creates a bottleneck for overall system performance.

Therefore, a need exists to provide a scheme to integrate the transceiver, voltage translator, and driver circuits as a single device by sharing current and voltage resources of transmitter and receiver. The present invention provides such a scheme.

There is also a need to obviate the shortcomings of the prior art by providing a transceiver using differential amplifier architecture occupying minimum area by resource sharing of transmitter and receiver.

There is also a need to provide a transceiver which can operate to implement high-speed signaling.

There is further a need to provide a low voltage differential signaling I/O buffer with efficient resource sharing by coupling two transceivers configured to produce complementary outputs.

There is further a need to provide a transceiver occupying minimum area by resource sharing of the transmitter and receiver.

SUMMARY OF THE INVENTION

To address the foregoing and other needs, an embodiment of the present invention comprises a transceiver providing high-speed transmission signal using shared resources and reduced area. A differential amplifier has its current source/sink connected to a supply terminal, and a multiplexing means is configured to connect an input of the differential amplifier to an I/O pad so as to output a received signal to internal integrated circuit logic during a receive mode and connect the output of the differential amplifier to the I/O pad so as to output a received signal from the internal integrated circuit logic during a transmit mode.

The current source/sink in one implementation is a p-channel transistor or n-channel transistor.

The multiplexing means in one implementation comprises at least three multiplexers, two at the input of said differential amplifier and one at output.

The p-channel transistor or n-channel transistor is configured in one implementation by a selector to receive bias, and to be switched to the higher voltage level during transmit mode and to lower voltage level during receive mode.

The multiplexer at the output of said differential amplifier may comprise transmission gates.

The selector may receive bias from a voltage divider network.

For differential signaling, a pair of said transceivers is connected to transmit and receive complimentary signals.

An embodiment of the present invention also provides a method for providing a transceiver to enable high-speed transmission signal comprising connecting the current source/sink of the differential to the supply terminal and configuring a multiplexing means for connecting the input of the differential amplifier to the I/O pad so as to output a received signal to the internal integrated circuit logic during a receive mode, and connecting the output of the differential amplifier to the I/O pad so as to output a received signal from internal integrated circuit logic during a transmission mode. The current source/sink is configured by a selector to receive bias from a voltage divider network for switching to higher voltage level during transmit mode and to lower voltage level during receive mode. The method further includes connecting a pair of transceiver for receiving and transmitting complimentary signals to implement differential signaling.

In accordance with an embodiment of the invention, a transceiver circuit interfaces an integrated circuit core input node, an integrated circuit core output node and an integrated circuit input/output node. A multiplexer has a first input for connection to the input/output node and a second input for connection to the core output node, the multiplexer having an output that is connected to the first input in a first mode and to the second input in a second mode. A selectable level shifting circuit has an input connected to the multiplexer output, the level shifting circuit performing signal level shifting of received core output node signals in the second mode but no signal level shifting of received input/output node signals in the first mode. A first transmission circuit has an input for connection to the level shifting circuit output and an output for connection to the core input node, the first transmission circuit operable to make an input to output connection for delivery of input/output node signals when in the first mode. A second transmission circuit has an input for connection to the level shifting circuit output and an output for connection to the input/output node, the second transmission circuit operable to make an input to output connection for delivery of level shifted core output node signals when in the second mode.

In accordance with another embodiment of the invention, a method is presented for interfacing an integrated circuit core input node, an integrated circuit core output node and an integrated circuit input/output node. An input/output node signal is selected from the input/output node in a first mode. A core output signal is selected from the core output node in a second mode. The selected input/output signal or core output signal is then passed through a selectable level shifting circuit, which includes performing signal level shifting on the core output signal in the second mode but no signal level shifting of the input/output signal in the first mode. The input/output signal from the selectable level shifting circuit is transmitted to the core input node when in the first mode, while the level shifted core output signal is transmitted from the selectable level shifting circuit to the input/output node when in the second mode.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
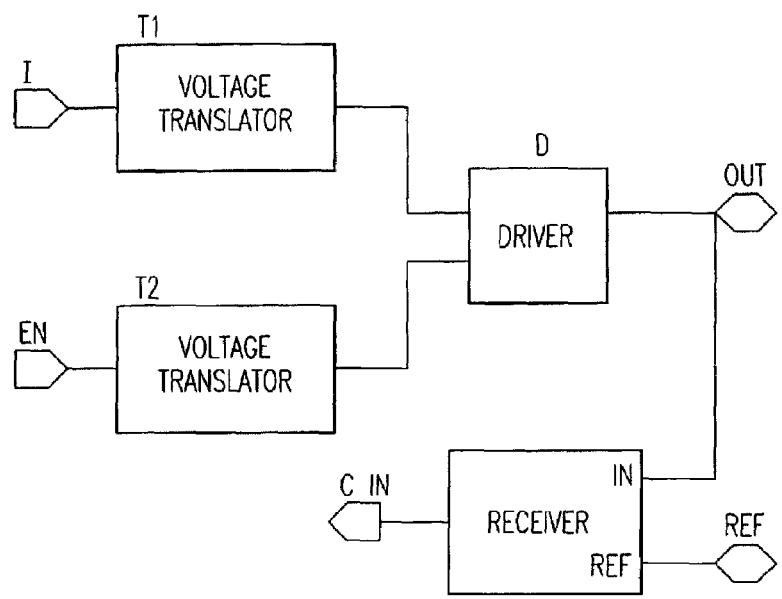
FIG. 1 shows a transceiver in accordance with the prior art.
Figure 2:
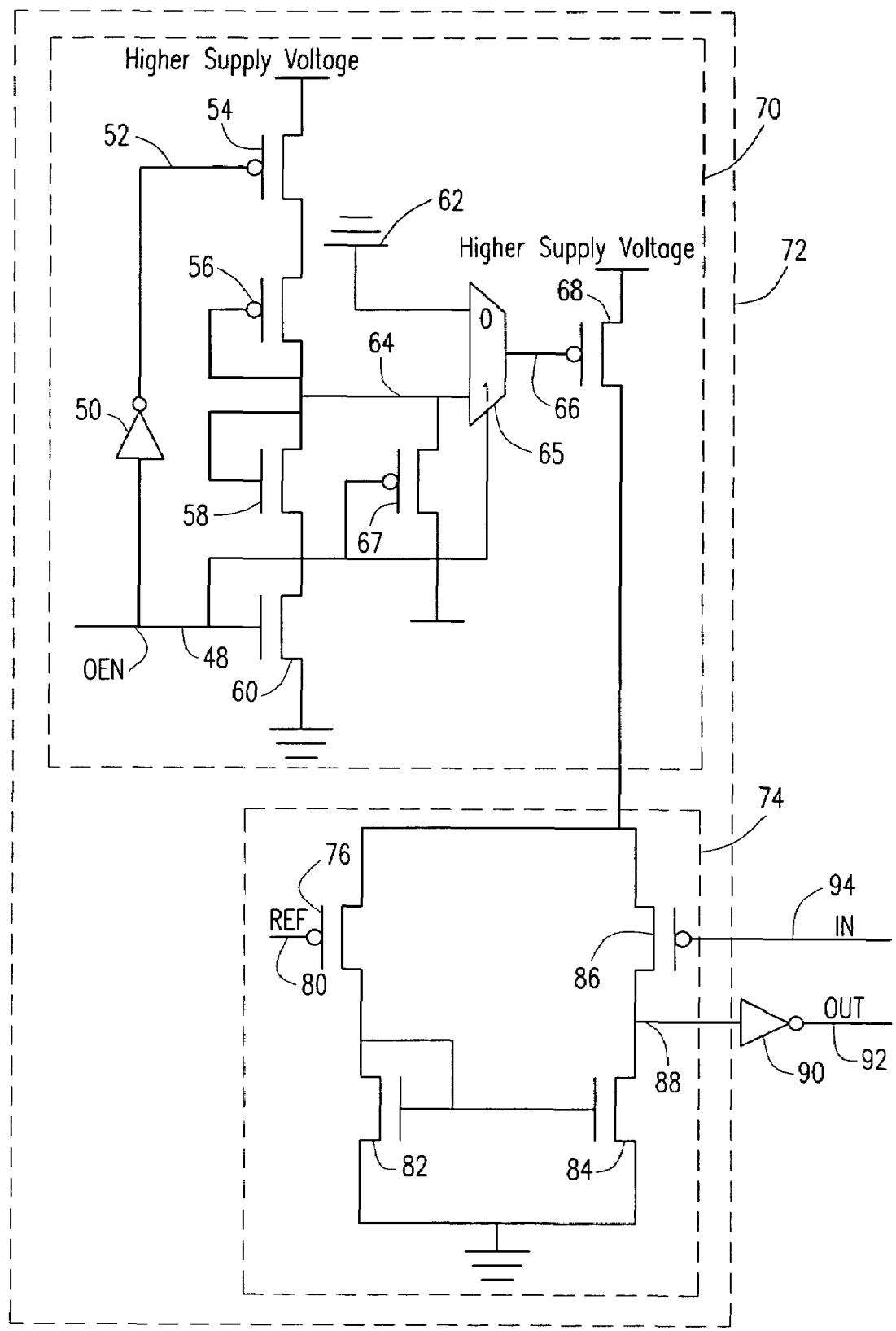
FIG. 2 shows the schematic of the present invention that is a differential receiver used as translator in the transmit mode.

FIG. 2 shows a receiver (reference 4 in FIG. 3) of a transceiver circuit used as a translator for transmission mode. A differential amplifier 72 is used for translating or receiving the data. The amplifier 72 is basically a p-channel input, differential amplifier. A circuit 70 within the amplifier 72 provides a bias current for an amplifying stage 74 that is included within the differential amplifier 72.

Transistors 54, 56, 58 and 60 within the bias circuit 70 are used for providing a particular bias through a voltage division operation. Whenever input signal OEN 48 is low, transmitter mode is selected, and signal 52 is high by virtue of the inverter 50. This turns transistors 54 and 60 off, and thus turns off the voltage divider within the bias circuit 70. Thus, a high voltage is passed on to the node 64 by transistor 67 to prevent the node 64 from floating. Multiplexer 65 however passes a ground reference 62 voltage to the gate 66 of P-channel transistor 68 because OEN 48 is low and turns on transistor 68 to supply the bias current to amplifier 74. Thus, the full current capability of the transistor 68 is utilized in the transmitter mode. This scheme is required when the transceiver needs higher current capability to translate data in the transmitter.

In receiver mode, input signal OEN 48 us high and thus signal 52 turns transistor 54 on. The OEN signal 48 also turns transistor 60 on. Through voltage division, a bias voltage is provided at node 64. The multiplexer 65 passes this bias voltage on to the gate 66 of current mirror transistor 68 because OEN 48 is high. The bias voltage at the gate 66 of transistor 68 causes less than the full current capability of transistor 68 to be utilized in the receiver mode. This scheme is required when the transceiver needs a better control on gain-bandwidth product in the receiver mode.

It can be appreciated by one of ordinary skill in the art that transistors 54 and 60, inverter 50 and multiplexer 65 can be removed and the source of transistor 56 and the source of transistor 58 can be connected to the power supply and ground, respectively. Biasing can then be provided by either of nodes 62 and 64 directly.

Whenever the voltage at signal IN 94 is higher than the voltage at REF 80, transistor 76 conducts more than transistor 86 and thus a low voltage is passed on to the node 88 through transistor 84. The output of the receiver OUT 92, therefore, achieves a high level logic through inverter 90.

Whenever, voltage at the signal IN 94 is lower than the voltage at REF 80, a high level is passed on to node 88 through the combination of transistor 68 and transistor 86. This voltage is less than the higher supply voltage. Inverter 90 is thus used to make node 92 achieve perfect ground. In this way, the receiver receives data from either the core or from the PAD and passes the desired output at the output OUT 92. One of ordinary skill in the art can appreciate that the embodiment of the invention can be applicable to the all of the high speed signaling standards.

Figure 3:
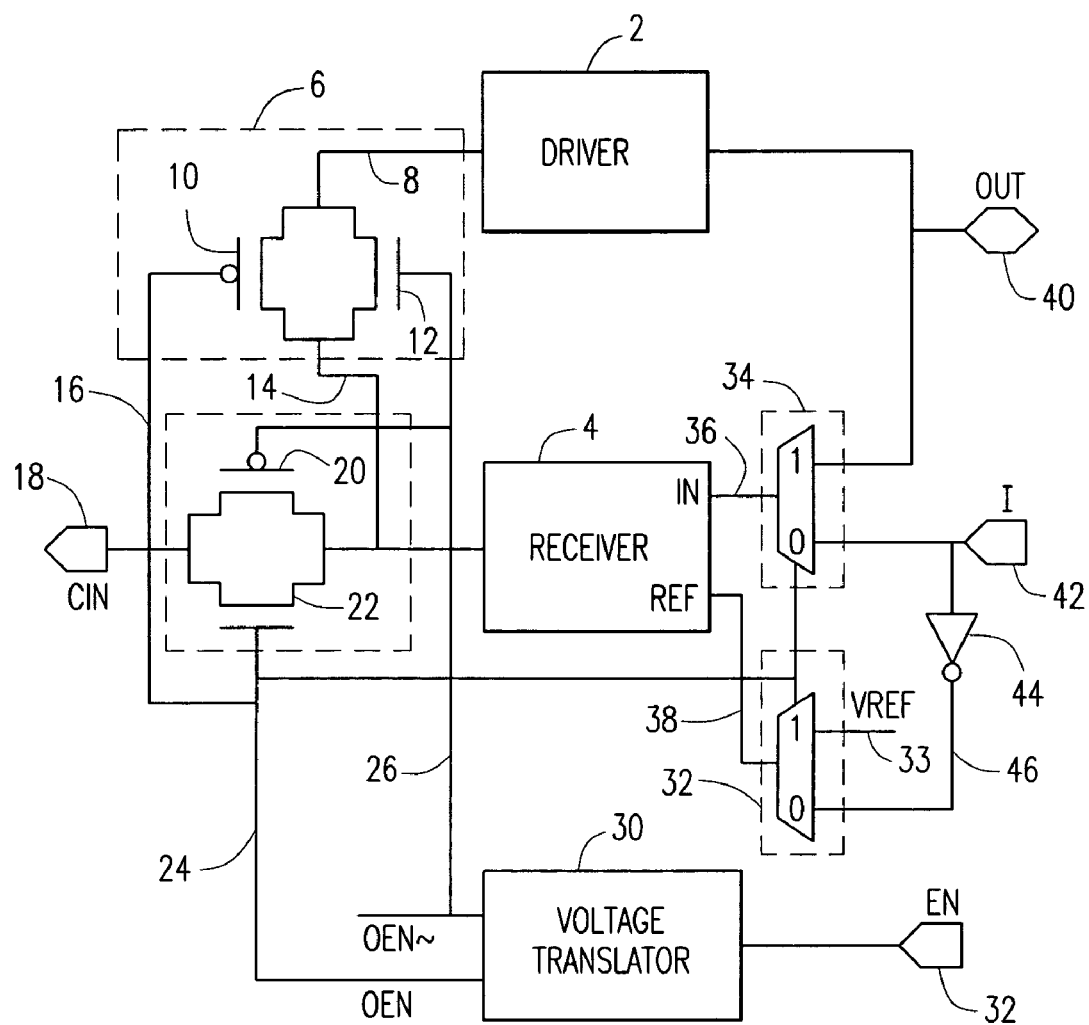
FIG. 3 shows the block diagram of an embodiment of the present invention where the transceiver sharing resources between low to high voltage translator used in the transmitter and receiver.

FIG. 3 illustrates the transceiver circuit in which the circuit of FIG. 2 is used as a low to high-level translator in the output mode and as a receiver in the input mode. This embodiment of the present invention can be used in GTL, HSTL, SSTL, and LVPECL where current requirement is high. A driver circuit 2 contains a pre-driver and a pad driver. The receiver 4 is used as a level translator in the transmitter mode. Signal I 42 and signal EN 32 are the signals coming from the core. OUT 40 defines the pad. A voltage translator 30 is used to translate the core voltage to I/O voltage. The signals OEN 24 and OEN~ 26 are the two complementary signals obtained from the voltage translator 30. The signal CIN 18 defines the input signal going to the core.

Whenever, EN 32 is low, the transceiver is placed in transmitter mode and OEN 24 is low and OEN~ 26 is high. Multiplexer 34 selects signal I 42 and passes it to the receiver 4 at its input IN 36. Similarly, multiplexer 32 selects complementary signal 46 obtained from inversion of signal I 42 by inverter 44 and passes it to the receiver 4 at its input REF 38. Receiver 4 then translates the core voltage swing for signal I 42 to the I/O voltage swing at node 14. With OEN 24 being low, this turns transistor 10 on and transistor 22 off. Similarly, with OEN~26 being high, this turns transistor 8 on and transistor 20 off. Thus, transmission gate 6 turns on and passes the signal at node 14 to the input 8 of the driver 2. Transmission gate 16 is tri-stated, thus inhibiting the transfer from node 14 to CIN 18 going to the core. Hence, it can be appreciated by those of ordinary skill in the art that the receiver 4 acts as a level translator in the transmitter mode.

When signal EN 32 is high, the transceiver is placed in the receiver mode and OEN is high and OEN~ is low. Multiplexer 34 then selects a signal coming from the pad OUT 40 and passes it at the input IN 36 of the receiver 4. Multiplexer 32 selects VREF 33 signal and transmits to the input REF 36 of the receiver 4 which is used for receiving a signal generated from transmitter of any of the high speed signaling standards like HSTL, SSTL, GTL. Transmission gate 16 turns on thus passing the received signal 14 to the CIN 18 going to the core.

It can also be appreciated by those of ordinary skill in the art that VREF 33 can be a signal complementary of OUT 40. In that case present embodiment is used for differential signaling of data.

Figure 4:
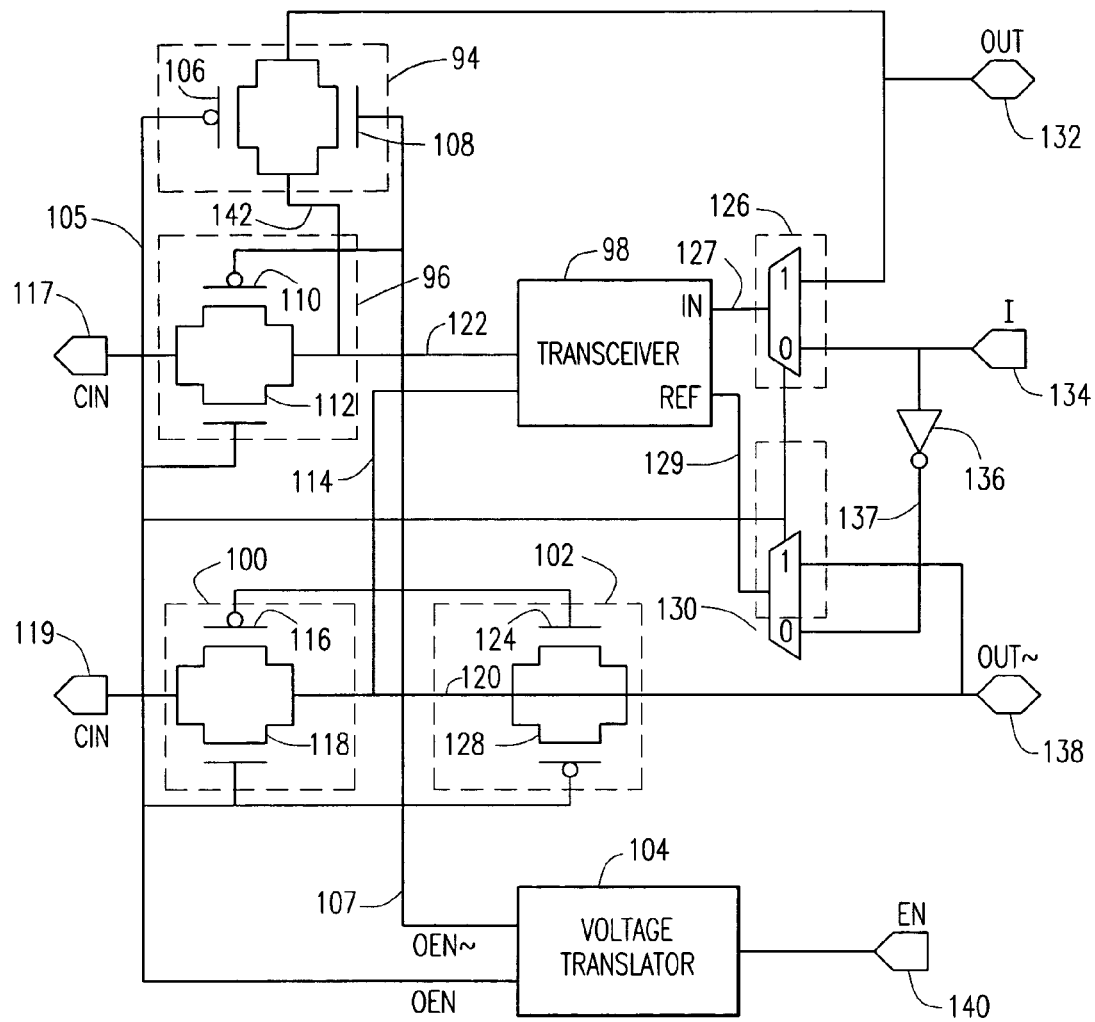
FIG. 4 shows the block diagram of another architecture using resource sharing between transmitter and receiver.

FIG. 4 gives an embodiment of the present invention in which the transmitter and receiver share resources. This scheme can be used for; signaling data where small current driving capability is required in the transmitter mode. For the sake of simplicity, illustration is made for a differential signaling of data. Transceiver 98 is used for transmitting and receiving data. Signal I 134 and signal EN 140 come from the core. Signal OUT 132 and signal OUT~ 138 define differential signals at the PAD. A voltage translator 30 is used to translate the core voltage to the I/O voltage. Signal OEN 105 and signal OEN~ 107 are the two complementary signals obtained from the voltage translator 104. Signal CIN 117 and signal CIN ~ 119 define two complementary input signals going to the core.

Whenever signal EN 140 is low, the transceiver is in transmitter mode and OEN 105 is low and OEN~ 107 is high. Multiplexer 126 selects signal I 134 and passes it on to the transceiver 98 at its input IN 127. Similarly, multiplexer 130 selects signal 137 obtained from inversion of signal I 134 by inverter 136 and passes it to the transceiver 98 at its input REF 129. Receiver 4 translates the core voltage swing I 134 to the I/O voltage swings at 122 and 114. With OEN 105 being low, this turns transistors 106 and 128 on and transistor 112 and 118 off. Similarly, with OEN~ 107 being high this turns transistors 108 and 124 on and 110 and 116 off. Thus, transmission gates 94 and 102 turn on and pass the signal at node 122 to the pad OUT 132. Transmission gates 96 and 100 are tri-stated, thus inhibiting the transfer to CIN 117 and CIN~ 119, respectively. Hence, it can be appreciated by those of ordinary skill in the art that the transceiver 124 acts as a transmitter in the transmitter mode.

When signal EN 140 is high, the transceiver is in receiver mode and OEN 105 is high and OEN~ 107 is low. Multiplexer 126 then selects a signal coming from the pad OUT 132 and passes it at the input IN 127 of the transceiver 98. Multiplexer 130 selects the OUT~ 138 signal and transmits it to the input REF 129 of the transceiver. Transmission gates 96 and 100 turn on thus passing the received signal 122 and signal 114 to the CIN 117 and CIN~ 119, respectively, going to the core. Transmission gates 94 and 102 remain off thus preventing any data transfer to the pad.

Figure 5:
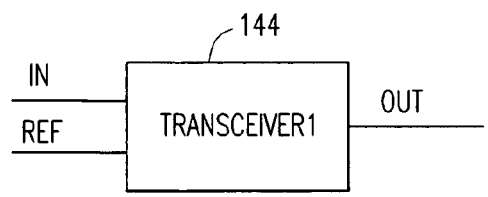
FIG. 5 shows the block diagram of the Transceivers for differential signaling in accordance with the present invention.
Figure 5:
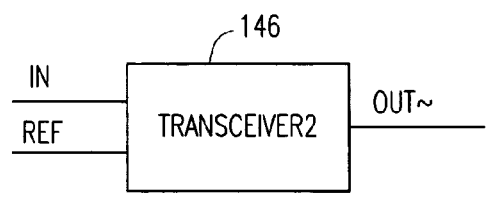

FIG. 5 shows the transceiver used in the embodiment of FIG. 4. Transceiver has two-part TRANSCEIVER1 144 and TRANSCEIVER2 146 configuration. TRANSCEIVER1 144 and TRANSCEIVER2 146 accept inputs and produce complementary outputs OUT and OUT~.

Figure 6:
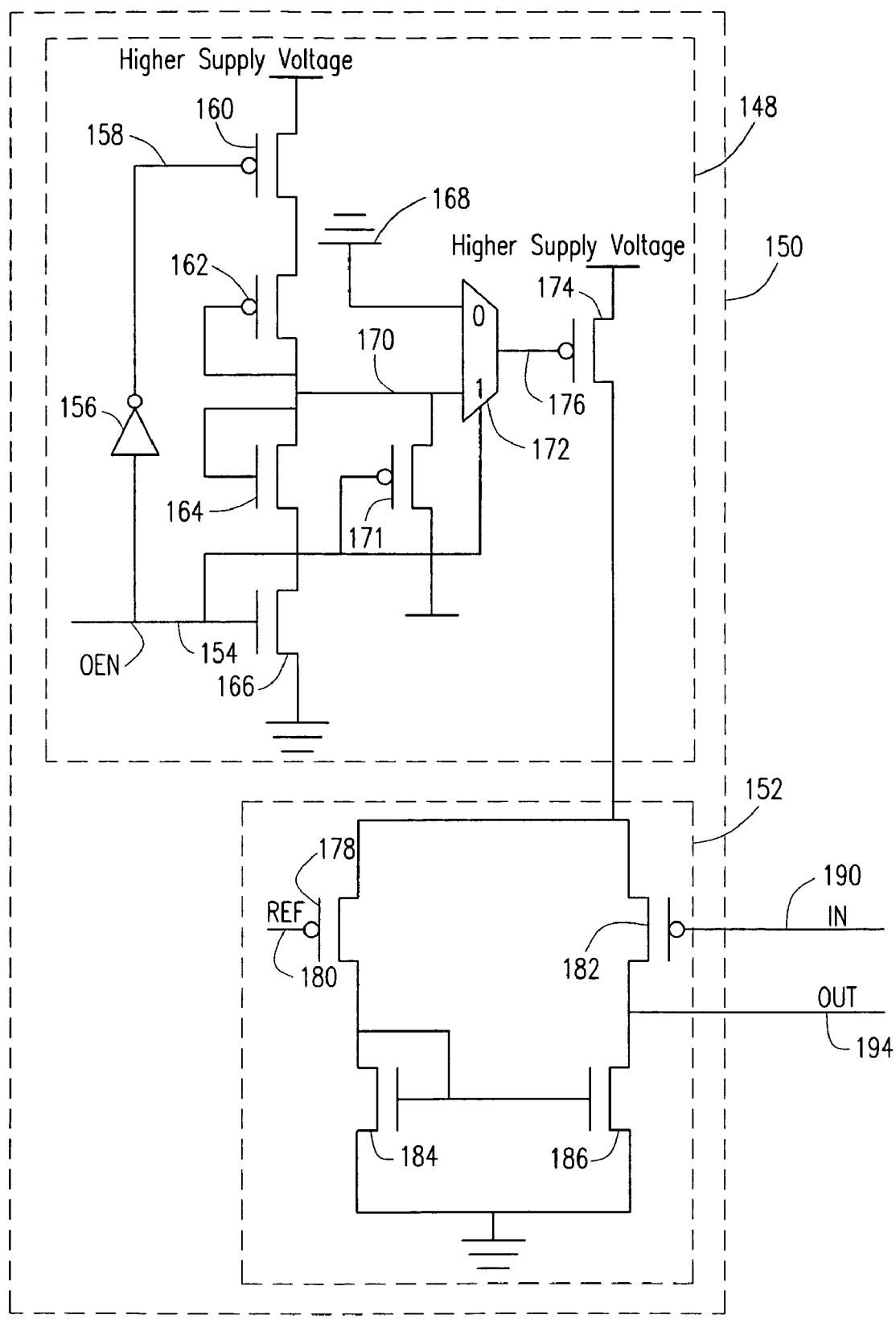
FIG. 6 shows the schematic of the first transceiver (Transceiver 1) as in FIG. 5.

FIG. 6 shows a circuit diagram of the TRANSCEIVER1 of FIG. 5. A differential amplifier 150 is used for transmitting or receiving the data. It is basically a p-channel input, differential amplifier. A circuit 140 is used for providing a bias current. Transistors 160, 162, 164 and 166 are used for providing a particular bias through a voltage division operation.

Whenever OEN 154 is low, the circuit is in transmitter mode and node 158 is high by virtue of the inverter 156. This makes transistors 166 and 160 turn off, thus turning the voltage divider off and a high voltage is passed on to the node 170 by transistor 171 to prevent it from floating. Multiplexer 172 then passes the ground reference 168 to the gate 176 of p-channel transistor 174. Thus, full current capability of the transistor 174 is utilized in the transmitter mode. This scheme is required when receiver needs higher current capability to translate data in the transmitter mode.

In receiver mode, OEN 154 is high and thus transistors 160 and 166 turn on to provide a bias voltage from the voltage divider at node 170. This bias voltage is passed on to the gate 176 of current mirror transistor 174 by multiplexer 172. This scheme is required when receiver needs a better control on gain-bandwidth product in the receiver mode.

It can be appreciated by those of ordinary skill in the art that transistors 160 and 166, inverter 156 and multiplexer 172 can be removed and source of transistor 162 and source of transistor 164 can be connected to the power supply and ground, respectively. Biasing can then be provided by either of 168 and 170 directly.

An amplifying stage 152 is provided for the differential amplifier. Whenever voltage at IN 190 is higher than the voltage at REF 180, transistor 178 conducts more than transistor 182 and thus a low voltage is passed on to OUT 194 through transistor 186. Whenever, voltage at the IN 190 is lower than the voltage at REF 180, a high level is passed on to OUT 194 through transistor 182 in conjunction with 174.

Figure 7:
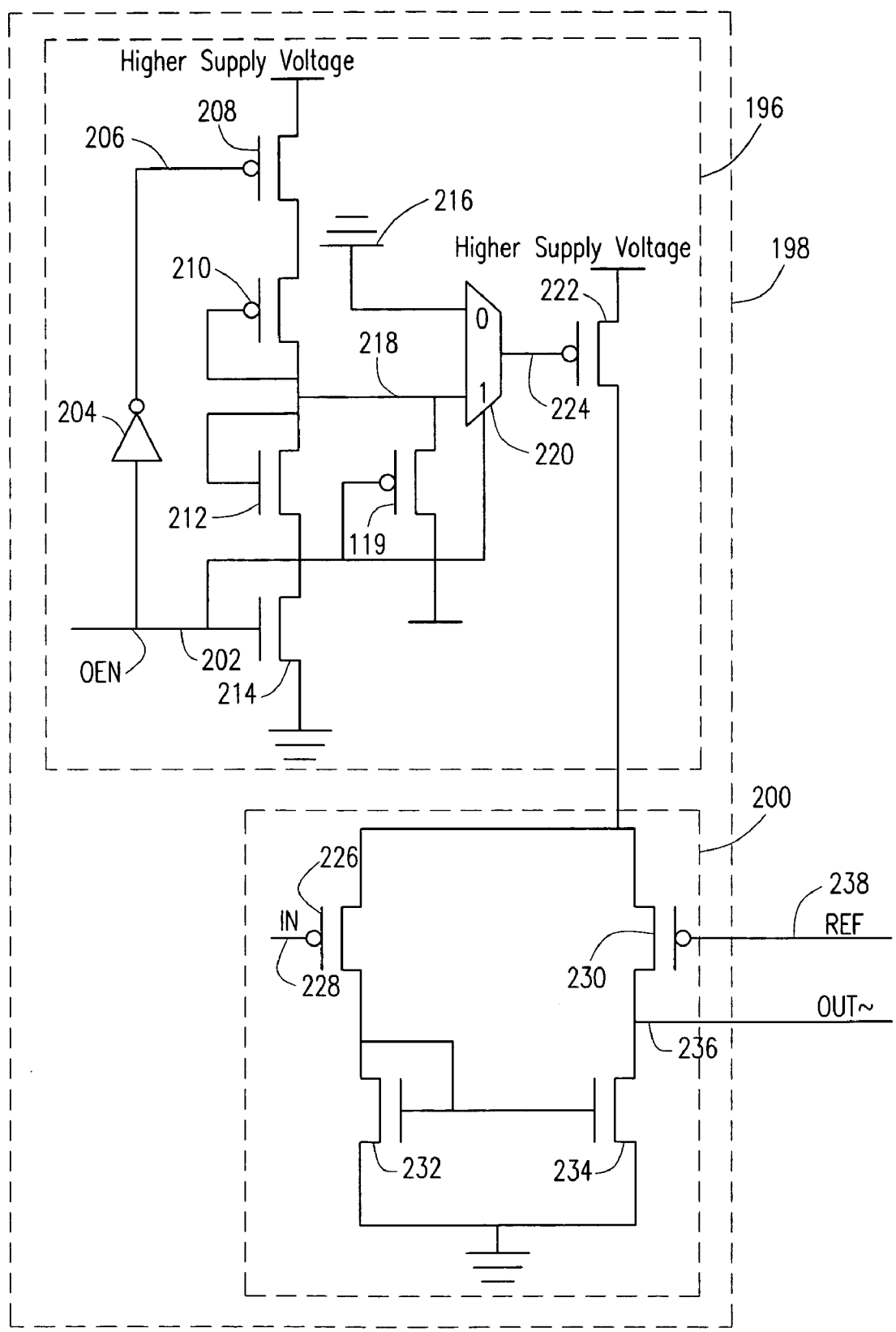
FIG. 7 shows the schematic of the second transceiver (Transceiver 2) as in FIG. 5.

FIG. 7 describes the TRANSCEIVER2 of FIG. 5. A differential amplifier 198 is used for transmitting or receiving the data. It is again a p-channel input, differential amplifier. A circuit 196 defines the circuit used for providing a bias current. Transistors 208, 210, 212 and 214 are used for providing a particular bias through a voltage division operation. Whenever OEN 202 is low, node 202 is high by virtue of the inverter 204. This turns transistors 208 and 214 off, thus turning the voltage divider off, and a high voltage is passed on to the node 218 by transistor 219 to prevent it from floating. Multiplexer 220 passes a ground reference 216 to the gate 224 of p-channel transistor 222. Thus, full current capability of the transistor 222 is utilized in the transmitter mode. This scheme is required when receiver needs higher current capability to translate data in the transmitter mode.

In receiver mode, transistors 160 and 166 turn on thus providing a bias voltage at node 170, which is passed on to the gate 176 of current mirror transistor 174. This scheme is required when the receiver needs a better control on gain-bandwidth product in the receiver mode.

It can be appreciated by the ordinary skill in the art that transistors 208 and 214, inverter 204 and multiplexer 220 can be removed and source of transistor 210 and source of transistor 212 can be connected to the power supply and ground, respectively. Biasing can then be provided by either of 216 and 218 directly.

An amplifying stage 200 is provided for the differential amplifier. Whenever voltage at REF 238 is higher than the voltage at IN 228, transistor 226 conducts more strongly than transistor 230 and thus a low voltage is passed on to OUT 236 through transistor 234. Whenever the voltage at REF 238 is lower than the voltage at IN 226, a high level is passed on to mode 236 through transistor 230 in conjunction with transistor 222.

It can thus be appreciated by those of ordinary skill in the art that TRANSCEIVER1 and TRANSCEIVER2 receive data from either the core or from the PAD and provide differential outputs.

It can also be appreciated by those of ordinary skill in the art that a resistance of 100 ohms may be connected between OUT 232 and OUT~ 138 to achieve differential swing at these nodes.

It can also be appreciated by those of ordinary skill in the art that the enable signal EN is used to make the sharing of resources possible.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A transceiver providing a high-speed transmission signal using shared resources and reduced area, comprising:
   a differential amplifier having its current source/sink connected to a supply terminal, and
   a multiplexer configured to connect in a first mode an input of the differential amplifier to an I/O pad so as to generate internal integrated circuit logic signals from input/output signals during a receive mode, and connect in a second mode an output of the differential amplifier to the I/O pad so as to generate input/output signals from internal integrated circuit logic signals during a transmit mode.

2. The transceiver as claimed in claim 1 wherein said current source/sink is a p-channel transistor or n-channel transistor.

3. The transceiver as claimed in claim 2 wherein said p-channel transistor or n-channel transistor is configured by a selector to receive bias, and to be switched to a higher voltage level during transmit mode and to a lower voltage level during receive mode.

4. The transceiver as claimed in claim 3 wherein said selector receives bias from a voltage divider network.

5. The transceiver as claimed in claim 1 wherein said multiplexer comprises at least three multiplexers, two at the input of said differential amplifier and one at the output of said differential amplifier.

6. The transceiver as claimed in claim 5 wherein said multiplexer at the output of said differential amplifier comprises transmission gates.

7. The transceiver as claimed in claim 1 wherein for differential signaling a pair of said transceivers is connected to transmit and receive complimentary signals.

8. A method for providing a transceiver enabling a high-speed transmission signal comprising the steps of:
   connecting a current source/sink of a differential amplifier to a supply terminal;
   configuring a multiplexer for connecting an input of the differential amplifier to an I/O pad so as to generate internal integrated circuit logic signals from input/output signals during a receive mode, and for connecting an output of the differential amplifier to the I/O pad so as to generate input/output signals from internal integrated circuit logic signals during a transmit mode, and
   configuring the current source/sink by a selector to receive bias from a voltage divider network for switching to a higher voltage level during transmit mode and to a lower voltage level during receive mode.

9. A transceiver circuit that interfaces an integrated circuit core input node, an integrated circuit core output node and an integrated circuit input/output node, comprising:

a multiplexer having a first input for connection to the input/output node and a second input for connection to the core output node, the multiplexer having an output that is connected to the first input in a first mode and to the second input in a second mode;
a selectable level shifting circuit having an input connected to the multiplexer output, the level shifting circuit performing signal level shifting of received core output node signals in the second mode but no signal level shifting of received input/output node signals in the first mode;
a first transmission circuit having an input for connection to the level shifting circuit output and an output for connection to the core input node, the first transmission circuit operable to make an input to output connection for delivery of input/output node signals when in the first mode; and
a second transmission circuit having an input for connection to the level shifting circuit output and an output for connection to the input/output node, the second transmission circuit operable to make an input to output connection for delivery of level shifted core output node signals when in the second mode.

10. The circuit of claim 9 further including a driver circuit interconnecting the output of the second transmission circuit to the input/output node.

11. The circuit of claim 9 wherein the input/output node is a signal input node in the first mode and is a signal output node in the second mode.

12. The circuit of claim 9 wherein the circuit operates to receive signals from the input/output node for transmission to the core input node in the first mode and operates to receive signals from the core output node for transmission to the input/output node in the second mode.

13. The circuit of claim 12 wherein the selectable level shifting circuit translates a first signal level of the signal received from the core output node to a second signal level of the signal transmitted to the input/output node in the second mode.

14. The circuit of claim 9 wherein the input/output node comprises differential input/output nodes.

15. The circuit of claim 9 wherein the core input node comprises differential core input nodes.

16. The circuit of claim 9 wherein the circuit operates in a differential signal processing mode.

17. The circuit of claim 9 wherein the selectable level shifting circuit comprises:
   an amplifier stage having an input connected to the level shifting circuit input and an output connected to the level shifting circuit output, the amplifier stage further having a bias node; and
   a bias circuit connected to the bias node, the bias circuit providing a lower bias current to the amplifier stage when in the first mode and a higher bias current to the amplifier stage when in the second mode.

18. The circuit of claim 17 wherein the bias circuit includes a selectable voltage divider circuit outputting a lower bias control voltage in the first mode and a higher bias control voltage in the second mode.

19. A method for interfacing an integrated circuit core input node, an integrated circuit core output node and an integrated circuit input/output node, comprising:
   selecting an input/output node signal from the input/output node in a first mode;
   selecting a core output signal from the core output node in a second mode;

passing the selected input/output signal or core output signal through a selectable level shifting circuit and performing signal level shifting on the core output signal in the second mode but no signal level shifting of the input/output signal in the first mode;

transmitting the input/output signal from the selectable level shifting circuit to the core input node when in the first mode; and transmitting the level shifted core output signal from the selectable level shifting circuit to the input/output node when in the second mode.

20. The method of claim 19 further including driving the level shifted core output signal for application to the input/output node.

21. The method of claim 19 wherein the input/output node is a signal input node in the first mode and is a signal output node in the second mode.

22. The method of claim 19 wherein the method receives signals from the input/output node for transmission to the core input node in the first mode and receives signals from the core output node for transmission to the input/output node in the second mode.

23. The method of claim 22 wherein passing comprises translating a first signal level of the core output signal to a second signal level of an input/output node signal.

24. The method of claim 19 wherein the method comprises differentially processing the input/output signal.

25. The method of claim 19 wherein the method comprises differentially processing the core input signal.

26. The method of claim 19 wherein the method processes signals differentially.

27. The method of claim 19 wherein passing comprises:
    amplifying a received signal in accordance with a bias current;
    providing a lower bias current for amplifying when in the first mode; and
    providing a higher bias current for amplifying when in the second mode.

28. The method of claim 27 providing the lower bias current comprises generating the bias circuit from a lower bias control voltage in the first mode and generating the bias current from a higher bias control voltage in the second mode.

* * * * *